United States Patent
Millward

(10) Patent No.: US 7,300,873 B2
(45) Date of Patent: Nov. 27, 2007

(54) SYSTEMS AND METHODS FOR FORMING METAL-CONTAINING LAYERS USING VAPOR DEPOSITION PROCESSES

(75) Inventor: Dan B. Millward, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 85 days.

(21) Appl. No.: 10/918,308

(22) Filed: Aug. 13, 2004

(65) Prior Publication Data

US 2006/0035462 A1 Feb. 16, 2006

(51) Int. Cl.
*H01L 21/44* (2006.01)
(52) U.S. Cl. .................. 438/681; 438/386; 438/648; 438/653; 438/656; 438/680; 438/681; 257/E21.17; 257/E21.585
(58) Field of Classification Search ............. None
See application file for complete search history.

(56) References Cited

U.S. PATENT DOCUMENTS

| | | | |
|---|---|---|---|
| 5,256,244 A | | 10/1993 | Ackerman |
| 5,924,012 A | * | 7/1999 | Vaartstra ............... 438/681 |
| 6,281,124 B1 | * | 8/2001 | Vaartstra ............... 438/681 |
| 6,323,511 B1 | * | 11/2001 | Marsh ..................... 257/295 |
| 2006/0270223 A1 | | 11/2006 | Millward |

OTHER PUBLICATIONS

Rische et al. "Mixed Guanidinato/Alkylimido/Azido Tungsten (VI) Complexes: Synthesis and Structural Characterization," *Inorganic Chemistry*, 2006;45(1):269-277. Published on the Web: Dec. 7, 2005.

Trifonov et al., "Chloro, Alkyl and Aryl Complexes of Rare Earth Metals Supported by Bulky Tetrasubstituted Guanidinate Ligands," *Eur J Inorg Chem*, 2006;2006(4):747-756. Published on the Web: Dec. 16, 2005.

Carmalt et al., "Synthesis of Titanium(IV) Guanidinate Complexes and the Formation of Titanium Carbonitride via Low-Pressure Chemical Vapor Deposition," *Inorganic Chemistry*, 2005;44:615-619 (Published online Jan. 7, 2005).

Trifonov et al., "Post-Metallocene Hydridolanthanide Chemistry: [Lu{(Me$_3$Si)$_2$NC(NiPr)$_2$}$_2$(μ-H)]$_2$- A Novel Lanthanide Hydride in a Non-Cyclopentadienyl Coordination Environment; Synthesis, Structure and Catalytic Activity in Olefin Polymerization," *Eur. J. Inorg. Chem.*, Nov. 2004;2004(22):4396-4401 (Published online Sep. 7, 2004).

Zhang et al., "Reactivity of Organolanthanide and Organolithium Complexes Containing the Guanidinate Ligands toward Isocyanate or Carbodiimide: Synthesis and Crystal Structures," *Inorganic Chemistry*, 2005;44:716-722 (Published online Jan. 5, 2005).

(Continued)

*Primary Examiner*—Michael Lebentritt
*Assistant Examiner*—Kyoung Lee
(74) *Attorney, Agent, or Firm*—Mueting, Raasch & Gebhardt P.A.

(57) ABSTRACT

A method of forming (and an apparatus for forming) a metal containing layer on a substrate, particularly a semiconductor substrate or substrate assembly for use in manufacturing a semiconductor or memory device structure, using one or more homoleptic and/or heteroleptic precursor compounds that include, for example, guanidinate, phosphoguanidinate, isoureate, thioisoureate, and/or selenoisoureate ligands using a vapor deposition process is provided.

64 Claims, 1 Drawing Sheet

OTHER PUBLICATIONS

Barry, Sean, Abstract for Poster No. 75, "Group 13 Guanidinates as Precursors for Atomic Layer Deposition," Abstract, *Atomic Layer Deposition Conference*, University of Helsinki, Finland, Aug. 16-18, 2004.

Calderazzo et al., "Synthesis of *N,N*-Dialkylcarbamato Complexes of Group 4 Metals (Ti, Zr, Hf) by the Metal Chloride-NHR$_2$-CO$_2$System (R=Et or Pr$^i$): Crystal and Molecular Structure of [Hf(O$_2$CNPr$^i_2$)$_4$]," *J Chem Soc Dalton Trans*, 1991:693-698.

Chandra et al., "Amido-derivatives of Metals and Metalloids. Part X: Reactions of Titanium, Zirconium, and Hafnium Amides with Unsaturated Substrates, and some Related Experiments with Amides of Boron, Silicon, Germanium, and Tin," *J Chem Soc (A)*, 1970:2550-2558.

Coles and Hitchcock, "Exploration of the Suitability of Bicyclic Guanidinates as Ligands in Catalytic Chemistry Mediated by Titanium," *Organometallics*, 2003;22:5201-5211, (Published Online-Nov. 5, 2003).

Coles and Hitchcock, "Zinc Guanidinate Complexes and their Application in Ring-Opening Polymerisation Catalysis," *Eur. J Inorg Chem.*, 2004:2662-2672, (Published Online- May 5, 2004).

Coles and Hitchcock, "Variable coordination chemistry of the phospha(III)guanidinate anion; application as a metal-functionalised phosphine ligand," *Chem Communication*, 2002:2794-2795.

Duncan et al., "Synthesis, Structural Investigation, and Reactivity of Neutral and Cationic Bis(guanidinato) zirconium(IV) Complexes," *Organometallics*, 2001;20: 1808-1819.

Foley et al., "Iron guanidinate complexes and formation of a novel dinuclear iron(II) species with a dianionic μ-η$^2$:η$^2$ (biguanidinate) ligand," *Chem Comm*, 2000;1515-1516.

Giesbrecht et al., "Alkali-metal guanidinates: solid-state structural diversity in solvent-free derivatives,": *J Chem Soc., Dalton Trans.*, 1999:3601-3604.

Hawley, G.G., "The Condensed Chemical Dictionary," 1981, 10$^{th}$ Edition, Van Nostrand Reinhold Co., New York, 225.

Jing-Lei et al., "Synthesis, characterization of homoleptic guanidino lanthanide complexes and their catalytic activity for the ring-opening polymerization of ϵ-caprolactone," *J of Organometallic Chemistry*, Mar. 2004;689:1019-1024.

Lim et al., "Atomic layer deposition of lanthanum aluminum oxide nano-laminates for electrical applications," *Applied Physics Letters*, May 17, 2004;84(20):3957-3959.

Lim et al., "Synthesis and Characterization of Volatile, Thermally Stable, Reactive Transition Metal Amindinates," *Inorg. Chem*, 2003;42:7951-7958 (Published Online- Oct. 25, 2003).

Lim et al., "Atomic layer deposition of transition metals," *Nature*, Nov. 2003;2:749-754.

Lu et al., "Tetrasubstituted Guanidinate Anions as Supporting Ligands in Organoyttrium Chemistry," *Organometallics*, 2001;20:706-712.

Mullins et al., "Reactivity of a Titanium Dinitrogen Complex Supported by Guanidinate Ligands: Investigation of Solution Behavior and a Novel Rearrangement of Guanidinate Ligands," *Inorg. Chem.*, 2001;40:6952-6963.

Oakley et al., "Structural diversity in the coordination of amidines and guanidines to monovalent metal halides," *Dalton Trans.*, 2004:537-546 (First published as in Advance Article online- Jan. 16, 2004).

Ong et al., "Transformations of Aryl Isocyanide on Guanidinate-Supported Organozirconium Complexes to Yield Terminal Imido, Iminoacyl, and Enediamido Ligands," *Organometallics*, Jan. 7, 2002;21(1):1-3.

Ong et al., "Formation of a Guanidinate-Supported Titanium Imido Complex: A Catalyst for Alkyne Hydroamination," *Organometallics*, 2002; 21:2839-2841.

Ong et al., "Redefining the Coordination Geometry and Reactivity of Guanidinate Complexes by Covalently Linking the Guanidinate Ligands. Synthesis and Reactivity of [RN{NH(R)}CN(CH$_2$)$_2$NC{NH(R)}NR]M(CH$_2$Ph)$_2$(R=$^i$Pr; M=Ti, Zr)," *Organometallics*, 2003;22:387-389 (Published Online Jan. 1, 2003).

Program for "Atomic Layer Deposition 2004" [online] Aug. 16-18, 2004, Helsinki, Finland. [Retrieved on Jul. 26, 2004]. Retrieved from the Internet: <URL:http://www.helsinki.fi/ALD2004/abstract.html>; 13 pgs.

Thirupathi et al., "Mono- and Dianionic Guanidinate Ligands. Reactivity of [$^i$PrN=C(N$^i$Pr)$_2$]Ta(NMe$_2$)$_3$ and [($^i$PrNH)C(N$^i$Pr)$_2$]TaCl(NMe$_2$)$_3$ with Me$_3$SiCl and ArNC (Ar=2,6-Me$_2$C$_6$H$_4$)," *Organometallics*, 2000; 19:2573-2579.

Vehkamaki et al., "Growth of SrTiO$_3$ and BaTiO$_3$ Thin Films by Atomic Layer Deposition," *Electrochemical and Solid-State Letters*, Oct. 1999;2(10):504-506.

Westmoreland et al., "Chiral Complexes of a New Diazaallyl Ligand; Group 4 Aminooxazolinates," *Organometallics*, 2004;23:5066-5074 (Published Online Sep. 16, 2004).

Wood et al., "N-Substituted Guanidinate Anions as Ancillary Ligands in Group 4 Chemistry. Syntheses and Characterization of M{RNC[N(SiMe$_3$)$_2$]NR}$_2$Cl$_2$, [M{CyNc{N(SiMe$_3$)$_2$]Ncy}Cl$_3$] {M=Zr, Hf; R=iPr, Cy), and Zr{CyNc[N(SiMe$_3$)$_2$]NCy}(Ch$_2$Ph)$_3$," *Inorg. Chem.*, 1999;38:5788-5794.

Zhang et al., "Insertion of a Carbodiimide into the Ln-N σ-Bond of Organolanthanide Complexes. Isomerization and Rearrangement of Organolanthanides Containing Guanidinate Ligands," *Organometallics*, 2004;23:3303-3308 (Published Online- May 25, 2004).

Knorr et al., "Configurational stability and reduced $^1$H-NMR shifts of (pseudo)tetrahedral nickel(II) bis-chelates of 1,3-diimines [1]," English language translation (19 pgs) of *Chem. Ber.*, 1981; 114:2104-2115 in German (12 pgs).

Milanov et al., "Guanidinate-Stabilized Monomeric Hafnium Amide Complexes as Promising Precursors for MOCVD of HfO$_2$," *Inorganic Chemistry*, 2006; 45(26):11008-11018 (11 pgs). Published on the web Dec. 1, 2006.

Schroth et al., "Nucleophilic addition of amines to diacetylene and 1 aminobut-1-en-3-ine," English language translation (4 pgs) of *Z. Chem.*, 1969; 9(3):110-111 (2 pgs).

Baunemann et al., "Mixed Amido/Imido/Guanidinato Complexes of Tantalum: Effects of Ligand Substitution on Thermal Properties," *European Journal of Inorganic Chemistry*, 2006; 22:4665-4672. Published online Sep. 25, 2006.

Heitmann et al., "Homoleptic lanthanide(II)-bis(guanidinate) complexes, [Ln(Giso$_2$)] (Giso = [(ArN)$_2$CN(C$_6$H$_{11}$)$_2$]$^-$, Ar=C$_6$H$_3$Pr$^i_2$-2,6): planar 4-coordinate (Ln = Sm or Eu) *vs* distorted tetrahedral (Ln = Yb) geometries," *Dalton Transactions*, 2007; 2:187-189. First published on the web Nov. 20, 2006.

Rische et al., "New Tungsten(VI) Guanidinato Complexes: Synthesis, Characterization, and Application in Metal-Organic Chemical Vapor Depostion of Tungsten Nitride Thin Films," *Chem. Mater.*, 2006; 18:6075-6082. Published on Web Nov. 15, 2006.

Devi et al., "Synthesis and characterisation of zirconium-amido guanidinato complex: a potential precursor for ZrO$_2$ thin films," *Dalton Trans.*, 2007;17:1671-1676. (First published as an Advance Article on the web Feb. 7, 2007).

* cited by examiner

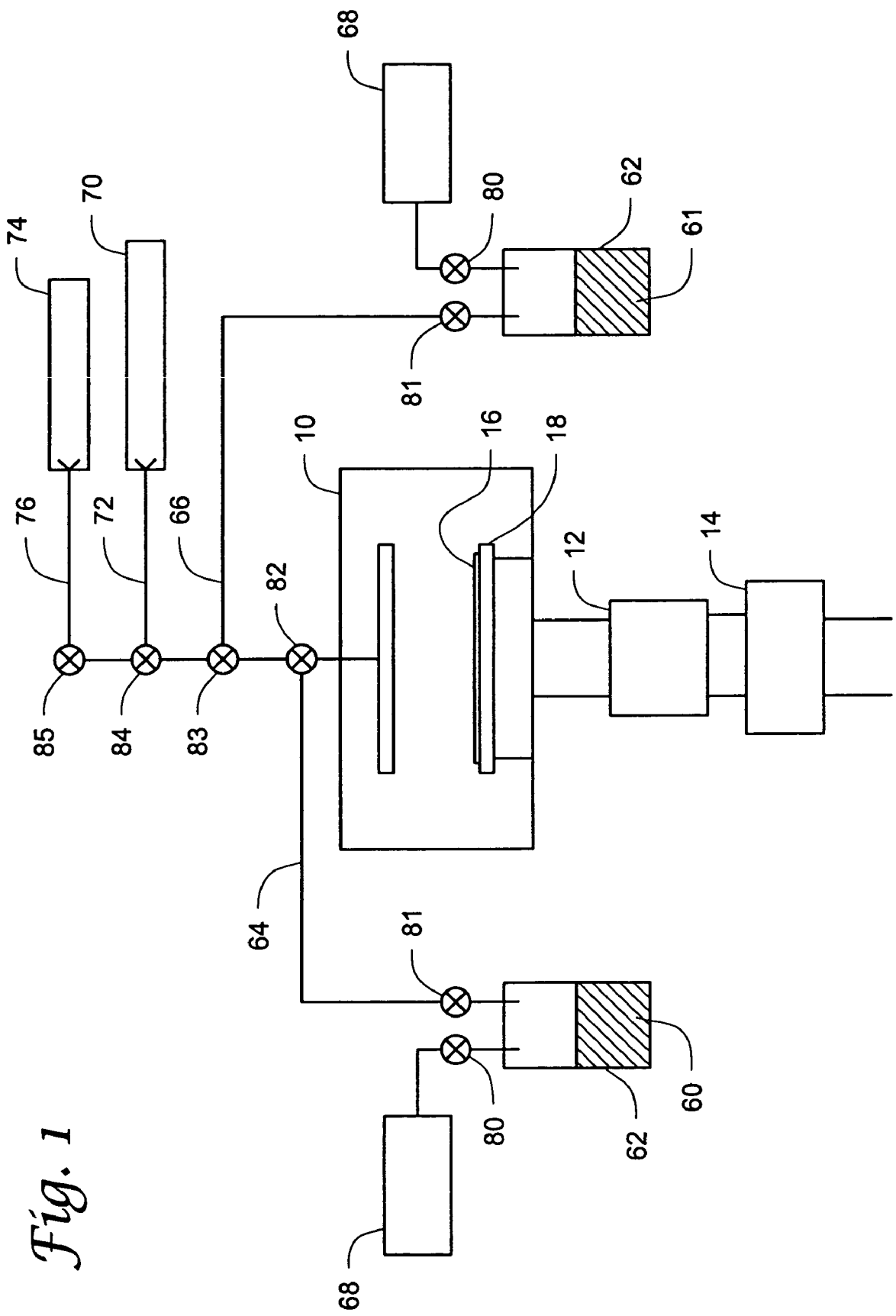

SYSTEMS AND METHODS FOR FORMING METAL-CONTAINING LAYERS USING VAPOR DEPOSITION PROCESSES

BACKGROUND OF THE INVENTION

In integrated circuit manufacturing, microelectronic devices such as capacitors are the basic energy storage devices in random access memory devices, such as dynamic random access memory (DRAM) devices, static random access memory (SRAM) devices, and ferroelectric memory (FERAM) devices. Capacitors typically consist of two conductors, such as parallel metal or polysilicon plates, which act as the electrodes (i.e., the storage node electrode and the cell plate capacitor electrode), insulated from each other by a layer of dielectric material.

The continuous shrinkage of microelectronic devices such as capacitors and gates over the years has led to a situation where the materials traditionally used in integrated circuit technology are approaching their performance limits. Silicon (i.e., doped polysilicon) has generally been the substrate of choice, and silicon dioxide ($SiO_2$) has frequently been used as the dielectric material with silicon to construct microelectronic devices. However, when the $SiO_2$ layer is thinned to 1 nanometer (nm) (i.e., a thickness of only 4 or 5 molecules), as is desired in the newest micro devices, the layer no longer effectively performs as an insulator due to the tunneling current running through it.

Thus, new high dielectric constant materials are needed to extend device performance. Such materials need to demonstrate high permittivity, barrier height to prevent tunneling, stability in direct contact with silicon, and good interface quality and film morphology. Furthermore, such materials must be compatible with the gate material, electrodes, semiconductor processing temperatures, and operating conditions.

Additionally, as integrated circuit (IC) dimensions shrink, the ability to deposit conformal thin films with excellent step coverage at low deposition temperatures is becoming increasingly important. Thin films are used, for example, in and/or for MOSFET gate dielectrics, DRAM capacitor dielectrics, adhesion promoting layers, diffusion barrier layers, electrode layers, seed layers, and/or for many other various functions. Low temperature processing is desired, for example, to better control certain reactions and to prevent degradation of previously deposited materials and their interfaces.

High quality thin oxide films of metals, such as $ZrO_2$, $Ta_2O_5$, $HfO_2$, $Al_2O_3$, $Nb_2O_5$, and YSZ deposited on semiconductor wafers have recently gained interest for use in memories (e.g., dynamic random access memory (DRAM) devices, static random access memory (SRAM) devices, and ferroelectric memory (FERAM) devices). These materials have high dielectric constants and therefore are attractive as replacements in memories for $SiO_2$ where very thin layers are required. These metal oxide layers are thermodynamically stable in the presence of silicon, minimizing silicon oxidation upon thermal annealing, and appear to be compatible with metal gate electrodes. Additionally, $Nb_2O_5$, $Nb_2O_5$, $La_2O_3$, and/or $Pr_2O_3$ doped/laminated $Al_2O_3$, $Ta_2O_5$, and $HfO_2$ films have been shown to be useful for capacitor and gate dielectrics. $Nb_2O_5$ doping/laminating has been shown to decrease leakage and stabilize crystalline phases.

Efforts have been made to investigate various deposition processes to form layers, especially dielectric layers, based on metal oxides and/or metal nitrides. Such deposition processes have included vapor deposition, metal thermal oxidation, and high vacuum sputtering. Vapor deposition processes, which include chemical vapor deposition (CVD) and atomic layer deposition (ALD) are very appealing, as they provide for excellent control of dielectric uniformity and thickness on a substrate.

SUMMARY OF THE INVENTION

In view of the foregoing, and despite improvements in semiconductor dielectric layers, there remains a need in the semiconductor art a vapor deposition process utilizing sufficiently volatile metal precursor compounds that can form a thin, high quality oxide layers on a substrate, particularly on a semiconductor substrate, using a vapor deposition process, particularly chemical vapor deposition (CVD) process and/or an atomic layer deposition (ALD) process.

Accordingly, the present invention is directed to methods and precursor compositions useful for CVD and ALD processes. In one aspect, the present invention is directed to: a method of forming a metal-containing layer on a substrate, the method including: providing a substrate; providing a precursor composition comprising at least one compound of the formula (Formula I):

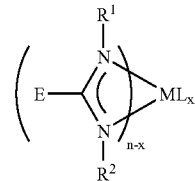

wherein: M is selected from the group of a Group 2 to Group 15 metal, a lanthanide, an actinide, and combinations thereof; E is $XR^3$ or $YR^3R^4$, wherein X is O, S, or Se, and Y is N or P; each $R^1$, $R^2$, and $R^3$ is independently an organic group; $R^4$ is hydrogen or an organic group; L is an anionic supporting ligand; n is the oxidation state of M; and x is 0 to n-1; vaporizing the precursor composition; and contacting the vaporized precursor composition to form a metal-containing layer on the substrate using a vapor deposition process.

In a further aspect, the present invention is directed to a method of manufacturing a semiconductor structure, the method including: providing a semiconductor substrate or substrate assembly; providing at least one precursor compound of the formula (Formula I):

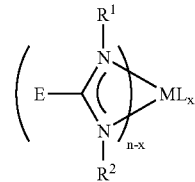

wherein: M is selected from the group of a Group 2 to Group 15 metal, a lanthanide, an actinide, and combinations thereof; E is $XR^3$ or $YR^3R^4$, wherein X is O, S, or Se, and Y is N or P; each $R^1$, $R^2$, and $R^3$ is independently an organic group; $R^4$ is hydrogen or an organic group; L is an anionic supporting ligand; n is the oxidation state of M; and x is 0 to n-1; providing at least one reaction gas; vaporizing the precursor compound of Formula I; and contacting the vaporized precursor compound of Formula I and the reaction gas with the substrate to form a metal-containing layer on the semiconductor substrate or substrate assembly using a vapor deposition process.

In yet another aspect, the present invention is directed to a method of manufacturing a semiconductor structure, the method including: providing a semiconductor substrate or substrate assembly within a deposition chamber; providing a vapor comprising at least one precursor compound of the formula (Formula I):

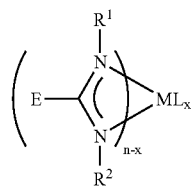

wherein: M is selected from the group of a Group 2 to Group 15 metal, a lanthanide, an actinide, and combinations thereof; E is $XR^3$ or $YR^3R^4$, wherein X is O, S, or Se, and Y is N or P; each $R^1$, $R^2$, and $R^3$ is independently an organic group; $R^4$ is hydrogen or an organic group; L is an anionic supporting ligand; n is the oxidation state of M; and x is 0 to n-1; directing the vapor including the at least one precursor compound of Formula I to the semiconductor substrate or substrate assembly and allowing the at least one compound to chemisorb to at least one surface of the semiconductor substrate or substrate assembly; providing at least one reaction gas; and directing the at least one reaction gas to the semiconductor substrate or substrate assembly with the chemisorbed species thereon to form a metal-containing layer on at least one surface of the semiconductor substrate or substrate assembly.

In still a further aspect, the present invention is directed to a method of manufacturing a memory device structure, the method including: providing a substrate having a first electrode thereon; providing at least one precursor compound of the formula (Formula I):

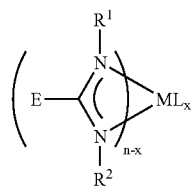

wherein: M is selected from the group of a Group 2 to Group 15 metal, a lanthanide, an actinide, and combinations thereof; E is $XR^3$ or $YR^3R^4$, wherein X is O, S, or Se, and Y is N or P; each $R^1$, $R^2$, and $R^3$ is independently an organic group; $R^4$ is hydrogen or an organic group; L is an anionic supporting ligand; n is the oxidation state of M; and x is 0 to n-1; vaporizing the at least one precursor compound of Formula I; contacting the at least one vaporized precursor compound of Formula I with the substrate to chemisorb the compound on the first electrode of the substrate; providing at least one reaction gas; contacting the at least one reaction gas with the substrate with the chemisorbed compound thereon to form a dielectric layer on the first electrode of the substrate; and forming a second electrode on the dielectric layer.

The present invention additionally is directed to apparatus useful for vapor deposition processes, preferably atomic layer deposition processes, as described herein. To this end, the present invention is further directed to a vapor deposition apparatus including: a deposition chamber having a substrate positioned therein; and at least one vessel including at least one precursor compound of the formula (Formula I):

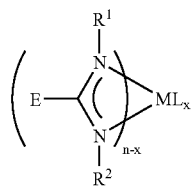

wherein: M is selected from the group of a Group 2 to Group 15 metal, a lanthanide, an actinide, and combinations thereof; E is $XR^3$ or $YR^3R^4$, wherein X is O, S, or Se, and Y is N or P; each $R^1$, $R^2$, and $R^3$ is independently an organic group; $R^4$ is hydrogen or an organic group; L is an anionic supporting ligand; n is the oxidation state of M; and x is 0 to n-1.

The present invention is additionally directed to certain precursor compositions useful for vapor deposition processes and disclosed herein. In one such embodiment, the present invention is directed to a precursor composition for use in a vapor deposition process including at least one compound of the formula (Formula I):

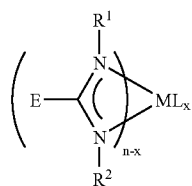

wherein: M is selected from the group of a Group 2 to Group 15 metal, a lanthanide, an actinide, and combinations thereof; E is $OR^3$; each $R^1$, $R^2$, and $R^3$ is independently an organic group; L is an anionic supporting ligand; n is the oxidation state of M; and x is 0 to n-1.

In another embodiment, the present invention is directed to a precursor composition for use in a vapor deposition process including at least one compound of the formula (Formula I):

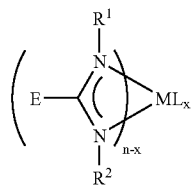

wherein: M is lanthanum; E is $XR^3$ or $YR^3R^4$, wherein X is O, S, or Se, and Y is N or P; each $R^1$, $R^2$, and $R^3$ is independently an organic group; R⁴ is hydrogen or an organic group; L is an anionic supporting ligand; n is the oxidation state of M; and x is 0 to n-1.

In yet a further embodiment, the present invention is directed to a precursor composition for use in a vapor deposition process including at least one compound of the formula (Formula I):

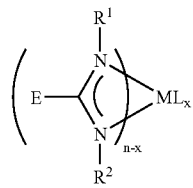

wherein: M is hafnium; E is $XR^3$ or $YR^3R^4$, wherein X is O, S, or Se, and Y is N or P; $R^1$ and $R^2$ are isopropyl groups, $R^3$ is an organic group; $R^4$ is hydrogen or an organic group; L is an anionic supporting ligand; n is the oxidation state of M; and x is 0 to n-1.

Metal-organic complexes containing chelating ligands (e.g., two or more atoms on each ligand coordinate to the metal atom) often show improved stability compared to metal-organic compounds with unidentate ligands and may be useful in deposition processes, provided such compounds have adequate volatility properties.

It has now been discovered that the use of homoleptic and heteroleptic guanidinate, phosphoguanidinate, isoureate, thioisoureate, and selenoisoureate compounds are useful as precursor compositions for vapor deposition, preferably ALD processes. Such compounds provide the potential advantage in, for example, an ALD process in that the protonated ligand (e.g., formed in situ after chemical adsorption to a surface) may be expected to decompose to carbodiimide and amine (from guanidinate), to phosphine (from phosphoguanidinate), to alcohol (from isoureate), to thiol (from thioisoureate), or to selenol (from selenoisoureate). These fragments are believed to be more volatile than the parent ligands and should, thus, leave less carbon contamination in the films.

BRIEF DESCRIPTION OF THE DRAWINGS

FIG. 1 is a perspective view of a vapor deposition coating system suitable for use in the method of the present invention.

DETAILED DESCRIPTION OF CERTAIN EMBODIMENTS

The present invention includes methods of forming a metal containing layer, preferably a metal oxide layer or a metal nitride layer, on a substrate. Further, such metal containing layer is preferably formed on a semiconductor substrate or substrate assembly in the manufacture of a semiconductor structure or another memory device structure. Such layers are deposited or chemisorbed onto a substrate and form, preferably, dielectric layers. The methods of the present invention involve forming a layer on a substrate by using one or more metal precursor compounds of the formula (Formula I):

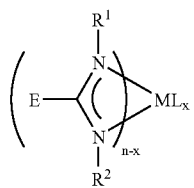

wherein: M is a Group 2 to Group 15 metal, a lanthanide, an actinide, and combinations thereof; E is $XR^3$ or $YR^3R^4$, wherein X is O, S, or Se, preferably O or S, and Y is N or P; each $R^1$, $R^2$, and $R^3$ is independently an organic group (as described in greater detail below); $R^4$ is hydrogen or an organic group; L is an anionic supporting ligand; n is the oxidation state of M; and x is 0 to n-1. Preferred ligands, L, include halides, amides, alkoxides, amidoxylates, amidinates, amidates, carboxylates, beta-diketonates, beta-iminekentones, beta-diketiminates, carbonylates, ketiminates, and combinations thereof.

As used herein, the term "organic group" is used for the purpose of this invention to mean a hydrocarbon group that is classified as an aliphatic group, cyclic group, or combination of aliphatic and cyclic groups (e.g., alkaryl and aralkyl groups). In the context of the present invention, suitable organic groups for precursor compounds of this invention are those that do not interfere with the formation of a metal oxide layer using vapor deposition techniques. In the context of the present invention, the term "aliphatic group" means a saturated or unsaturated linear or branched hydrocarbon group. This term is used to encompass alkyl, alkenyl, and alkynyl groups, for example. The term "alkyl group" means a saturated linear or branched monovalent hydrocarbon group including, for example, methyl, ethyl, n-propyl, isopropyl, t-butyl, amyl, heptyl, and the like. The term "alkenyl group" means an unsaturated, linear or branched monovalent hydrocarbon group with one or more olefinically unsaturated groups (i.e., carbon-carbon double bonds), such as a vinyl group. The term "alkynyl group" means an unsaturated, linear or branched monovalent hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.). For example, certain preferred organic groups include cyclic polyethers, polyamines, aromatic groups, heterocyclic groups, etc.

As a means of simplifying the discussion and the recitation of certain terminology used throughout this application, the terms "group" and "moiety" are used to differentiate between chemical species that allow for substitution or that may be substituted and those that do not so allow for substitution or may not be so substituted. Thus, when the term "group" is used to describe a chemical substituent, the described chemical material includes the unsubstituted group and that group with nonperoxidic O, N, S, Si, or F atoms, for example, in the chain as well as carbonyl groups or other conventional substituents. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, t-butyl, and the like.

The precursor compounds described herein may include a wide variety of metals. As used herein, "metal" includes all metals of the periodic table (including main group metals, transition metals, lanthanides, actinides, and metalloid such as B, Al, Ge, Si, As, Sb, Te, Po, At, etc.). For certain methods of the present invention, preferably, each metal M is selected from the group of metals of Groups 2-15, the lanthanides, the actinides of the Periodic Chart, and combinations thereof. Preferably, for metal-oxide layers, M is selected from the group of Groups 3-5, Group 13, the lanthanides, and combinations thereof. More preferably, M is selected from the group of Hf, Zr, Al, La, Pr, and combinations thereof.

Additionally, E is $(XR^3)$ or $(YR^3R^4)$, with X being O, S, or Se, Y being N or P, and $R^1$, $R^2$, $R^3$, and $R^4$ of Formula I being each independently an organic group, and with $R^4$ optionally being hydrogen. Preferably, each of the organic groups of $R^1$, $R^2$, $R^3$, and $R^4$ contain 1-10 carbon atoms, more preferably, 1-6 carbon atoms, and most preferably, 1-4 carbon atoms. Preferred R groups include isopropyl groups.

Additionally, each of the organic groups $R^1$, $R^2$, $R^3$, and $R^4$ may optionally include one or more heteroatoms (e.g., oxygen, nitrogen, fluorine, etc.), or functional groups (e.g., carbonyl groups, hydroxycarbyl groups, aminocarbyl groups, alcohols, fluorinated alcohols, etc.), provided that the heteroatoms are not directly bonded to hydrogen. That is, included within the scope of the compounds of Formula I are compounds wherein at least one atom in the organic group has been replaced with, for example, one of a carbonyl group, a hydroxycarbyl group, an oxygen atom, a nitrogen atom, or an aminocarbyl group. Certain preferred organic groups, $R^1$, $R^2$, $R^3$, and $R^4$, of Formula I include (C1-C4) alkyl groups, which may be linear, branched, or cyclic groups, as well as alkenyl groups (e.g., dienes and trienes), or alkynyl groups. An example of a preferred precursor compound of Formula I is: $La((iPrN)_2CNEt_2)_3$, wherein iPr is isopropyl and Et is ethyl.

The terms "substrate," "semiconductor substrate," or "substrate assembly" as used herein refer to either a substrate or a semiconductor substrate, such as a base semiconductor layer or a semiconductor substrate having one or more layers, structures, or regions formed thereon. A base semiconductor layer is typically the lowest layer of silicon material on a wafer or a silicon layer deposited on another material, such as silicon on sapphire. When reference is made to a substrate assembly, various process steps may have been previously used to form or define regions, junctions, various structures or features, and openings such as transistors, active areas, diffusions, implanted regions, vias, contact openings, high aspect ratio openings, capacitor plates, barriers for capacitors, etc.

"Layer," as used herein, refers to any layer that can be formed on a substrate from one or more precursors and/or reactants according to the deposition process described herein. The term "layer" is meant to include layers specific to the semiconductor industry, such as, but clearly not limited to, a barrier layer, dielectric layer, and conductive layer. The term "layer" is synonymous with the term "film" frequently used in the semiconductor industry. The term "layer" is also meant to include layers found in technology outside of semiconductor technology, such as coatings on glass. For example, such layers can be formed directly on fibers, wires, etc., which are substrates other than semiconductor substrates. Further, the layers can be formed directly on the lowest semiconductor surface of the substrate, or they can be formed on any of a variety of layers (e.g., surfaces) as in, for example, a patterned wafer.

"Dielectric layer" as used herein refers to a layer (or film) having a high dielectric constant containing primarily, for example, silicon oxides, zirconium oxides, aluminum oxides, tantalum oxides, titanium oxides, niobium oxides, hafnium oxides, an oxide of a lanthanide, or combinations thereof.

The terms "deposition process" and "vapor deposition process" as used herein refer to a process in which a metal-containing layer is formed on one or more surfaces of a substrate (e.g., a doped polysilicon wafer) from vaporized precursor compound(s). Specifically, one or more precursor compounds are vaporized and directed to and/or contacted with one or more surfaces of a heated substrate (e.g., semiconductor substrate or substrate assembly) placed in a deposition chamber. These precursor compounds form (e.g., by reacting or decomposing) a non-volatile, thin, uniform, metal-containing layer on the surface(s) of the substrate. For the purposes of this invention, the term "vapor deposition process" is meant to include both chemical vapor deposition processes (including pulsed chemical vapor deposition processes) and atomic layer deposition processes.

"Chemical vapor deposition" (CVD) as used herein refers to a vapor deposition process wherein the desired layer is deposited on the substrate from vaporized metal precursor compounds (and any reaction gases used) within a deposition chamber with no effort made to separate the reaction components. In contrast to a "simple" CVD process that involves the substantial simultaneous use of the precursor compounds and any reaction gases, "pulsed" CVD alternately pulses these materials into the deposition chamber, but does not rigorously avoid intermixing of the precursor and reaction gas streams, as is typically done in atomic layer deposition or ALD (discussed in greater detail below).

The term "atomic layer deposition" (ALD) as used herein refers to a vapor deposition process in which deposition cycles, preferably a plurality of consecutive deposition cycles, are conducted in a process chamber (i.e., a deposition chamber). Typically, during each cycle the precursor is chemisorbed to a deposition surface (e.g., a substrate assembly surface or a previously deposited underlying surface such as material from a previous ALD cycle). Thereafter, if necessary, a reactant may subsequently be introduced into the process chamber for use in converting the chemisorbed precursor to the desired material on the deposition surface. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE) (see U.S. Pat. No. 5,256,244 to Ackerman), molecular beam epitaxy (MBE), gas source MBE, or organometallic MBE, and chemical beam epitaxy when performed with alternating pulses of precursor compound(s), reactive gas, and purge (e.g., inert carrier) gas.

As compared to the one cycle chemical vapor deposition (CVD) process, the longer duration multi-cycle ALD process allows for improved control of layer thickness by self-limiting layer growth and minimizing detrimental gas phase reactions by separation of the reaction components.

"Precursor," and "precursor compound" as used herein, refers to a compound usable for forming, either alone or with other precursor compounds (or reactants), a layer on a substrate assembly in a deposition process. In one embodiment according to the present invention, the precursor includes a metal component and one or more guanidinate, phosphoguanidinate, isoureate, thioisoureate, and/or selenoisoureate ligands. Further, one skilled in the art will recognize that the precursor will depend on the content of a layer which is ultimately to be formed using a vapor deposition process. The preferred precursor compounds of the present invention are preferably liquid at the vaporization temperature and, more preferably, are preferably liquid at room temperature.

The term "chemisorption" as used herein refers to the chemical adsorption of vaporized reactive precursor compounds on the surface of a substrate. The adsorbed species are typically irreversibly bound to the substrate surface as a result of relatively strong binding forces characterized by high adsorption energies (e.g., >30 kcal/mol), comparable in strength to ordinary chemical bonds. The chemisorbed species typically form a mononolayer on the substrate surface. (See "The Condensed Chemical Dictionary", 10th edition, revised by G. G. Hawley, published by Van Nostrand Reinhold Co., New York, 225 (1981)). The technique of ALD is based on the principle of the formation of a saturated monolayer of reactive precursor molecules by chemisorption. In ALD one or more appropriate precursor compounds or reaction gases are alternately introduced (e.g., pulsed) into a deposition chamber and chemisorbed onto the surfaces of a substrate. Each sequential introduction of a reactive compound (e.g., one or more precursor compounds and one or more reaction gases) is typically separated by an inert carrier gas purge. Each precursor compound co-reaction adds a new atomic layer to previously deposited layers to form a cumulative solid layer. The cycle is repeated, typically for several hundred times, to gradually form the desired layer thickness. It should be understood that ALD can alternately utilize one precursor compound, which is chemisorbed, and one reaction gas, which reacts with the chemisorbed species.

Practically, chemisorption might not occur on all portions of the deposition surface (e.g., previously deposited ALD material). Nevertheless, such imperfect monolayer is still considered a monolayer in the context of the present invention. In many applications, merely a substantially saturated monolayer may be suitable. A substantially saturated monolayer is one that will still yield a deposited monolayer or less of material exhibiting the desired quality and/or properties.

"Reactant," as used herein, may include another precursor or reactant gas useable according to the present invention in an ALD cycle. For example, to prepare a metal oxide layer, a reactant gas may include an oxidizing gas such as oxygen, water vapor, ozone, alcohol vapor, nitrogen oxide, sulfur oxide, hydrogen peroxide, and the like. To prepare a metal-nitride layer, a reactant gas may include, for example, ammonia or amines (preferably primary amines). To prepare a pure metal layer, a reactant gas may include hydrogen, diborane or silane. However, such reactants may include any reactant(s) suitable for use in converting the chemisorbed species present on the deposition surface as part of an ALD cycle (e.g., provide a reducing atmosphere). As one skilled in the art will recognize, such reactants will depend upon the layer ultimately formed from the vapor deposition process.

"Inert gas," or "non-reactive gas," as used herein, is any gas that is generally unreactive with the components it comes in contact with. For example, inert gases are typically selected from a group including nitrogen, argon, helium, neon, krypton, xenon, any other non-reactive gas, and mixtures thereof. Such inert gases are generally used in one or more purging processes described according to the present invention.

"Purging," according to the present invention, may involve a variety of techniques including, but not limited to, contacting the substrate and/or monolayer(s) formed according to the present invention with a carrier gas (e.g., an inert gas), and/or lowering pressure to below the deposition pressure to reduce the concentration of a species contacting the substrate assembly surface and/or chemisorbed species. Purging may also include contacting the substrate assembly surface and/or monolayer(s) formed thereon with any substance that allows chemisorption byproducts to desorb and reduces the concentration of a species preparatory to introducing another species. A suitable amount of purging can be determined experimentally, as known to those skilled in the art. Purging time may successively be reduced to a purge time that yields desirable results, such as an increase in film growth rate.

The layers or films formed may be in the form of metal-containing films, such as reduced metals, metal silicates, metal oxides, metal nitrides, etc, as well as combinations thereof. For example, a metal oxide layer may include a single metal, or the metal oxide layer may include two or more different metals (i.e., it is a mixed metal oxide) or a metal oxide layer may optionally be doped with other metals.

If the metal oxide layer includes two or more different metals, the metal oxide layer can be in the form of alloys, solid solutions, or nanolaminates. Preferably, these have dielectric properties. The metal oxide layer (particularly if it is a dielectric layer) preferably includes one or more of $HfO_2$, $ZrO_2$, $Al_2O_3$, $La_2O_3$, and $Pr_2O_3$. Surprisingly, the metal oxide layer formed according to the present invention is essentially free of carbon. In addition, preferably the reduced metal layers formed by the systems and methods of the present invention are essentially free of carbon, hydrogen, halides, oxygen, phosphorus, sulfur, nitrogen, or compounds thereof. Additionally, preferably metal-oxide layers formed by the systems and methods of the present invention are essentially free of carbon, hydrogen, halides, phosphorus, sulfur, nitrogen or compounds thereof, and preferably metal-nitride layers formed by the systems and methods of the present invention are essentially free of carbon, hydrogen, halides, oxygen, phosphorus, sulfur, or compounds thereof. As used herein, "essentially free" is defined to mean that the metal-containing layer may include a small amount of the above impurities. For example, for metal-oxide layers, "essentially free" means that the above impurities are present in an amount of less than about 1 percent (%) by weight, such that they have a minor effect on the chemical, mechanical, or electrical properties of the film. Pure metal layers and metal-nitride layers, may tolerate a higher impurity content. For these layers, "essentially free" means that the above impurities are present in an amount of less than about 20% by weight.

In addition to the precursor compositions of Formula I, the present invention includes methods and apparatus in which a metal containing precursor compound different that the precursor compound of Formula I may be used. Such precursors may be deposited/chemisorbed, for example in an ALD process discussed more fully below, substantially simultaneously with or sequentially to the precursor compounds of Formula I.

Various precursor compounds can be used in various combinations, optionally with one or more organic solvents (particularly for CVD processes), to form a precursor composition. The precursor compounds may be liquids or solids at room temperature (preferably, they are liquids at the vaporization temperature). Typically, they are liquids sufficiently volatile to be employed using known vapor deposition techniques. However, as solids they may also be sufficiently volatile that they can be vaporized or sublimed from the solid state using known vapor deposition techniques. If they are less volatile solids, they are preferably sufficiently soluble in an organic solvent or have melting points below their decomposition temperatures such that they can be used in flash vaporization, bubbling, microdroplet formation techniques, etc.

Herein, vaporized precursor compounds may be used either alone or optionally with vaporized molecules of other precursor compounds or optionally with vaporized solvent molecules, if used. As used herein, "liquid" refers to a solution or a neat liquid (a liquid at room temperature or a solid at room temperature that melts at an elevated temperature). As used herein, "solution" does not require complete solubility of the solid but may allow for some undissolved solid, as long as there is a sufficient amount of the solid delivered by the organic solvent into the vapor phase for chemical vapor deposition processing. If solvent dilution is used in deposition, the total molar concentration of solvent vapor generated may also be considered as a inert carrier gas.

Solvents that are suitable for certain embodiments of the present invention may be one or more of the following: aliphatic hydrocarbons or unsaturated hydrocarbons (C3-C20, and preferably C5-C10, cyclic, branched, or linear), aromatic hydrocarbons (C5-C20, and preferably C5-C10), halogenated hydrocarbons, silylated hydrocarbons such as alkylsilanes, alkylsilicates, ethers, polyethers, thioethers, esters, lactones, nitrites, silicone oils, or compounds containing combinations of any of the above or mixtures of one or more of the above. The compounds are also generally compatible with each other, so that mixtures of variable quantities of the precursor compounds will not interact to significantly change their physical properties.

The precursor compounds of the present invention can, optionally, be vaporized and deposited/chemisorbed substantially simultaneously with, and in the presence of, one or more reaction gases. Alternatively, the metal containing layers may be formed by alternately introducing the precursor compound and the reaction gas(es) during each deposition cycle. Such reaction gases may typically include oxygen, water vapor, ozone, nitrogen oxides, sulfur oxides, hydrogen, hydrogen sulfide, hydrogen selenide, hydrogen telluride, hydrogen peroxide, ammonia, organic amine, silane, disilane and higher silanes, diborane, plasma, air, borazene (nitrogen source), carbon monoxide (reductant), alcohols, and any combination of these gases, noting that certain reaction gases may be more appropriate for certain metal-containing layers. For example, oxygen sources for the deposition of metal-oxide layers, nitrogen sources for deposition of metal-nitride layers, and reductants for deposition of reduced metal layers. Preferable optional reaction gases for metal-oxide layers include oxygen and ozone.

Suitable substrate materials of the present invention include conductive materials, semiconductive materials, conductive metal-nitrides, conductive metals, etc. The substrate on which the metal containing layer is formed is preferably a semiconductor substrate or substrate assembly. Any suitable semiconductor material is contemplated, such as for example, borophosphosilicate glass (BPSG), silicon such as, e.g., conductively doped polysilicon, monocrystalline silicon, etc. (for this invention, appropriate forms of silicon are simply referred to as "silicon"), for example in the form of a silicon wafer, tetraethylorthosilicate (TEOS) oxide, spin on glass (i.e., a thin layer of $SiO_2$, optionally doped, deposited by a spin on process), TiN, TaN, W, Ru, Al, Cu, noble metals, etc. A substrate assembly may also contain a layer that includes platinum, iridium, rhodium, ruthenium, ruthenium oxide, titanium nitride, tantalum nitride, tantalum-silicon-nitride, silicon dioxide, aluminum, gallium arsenide, glass, etc., and other existing or to-be-developed materials used in semiconductor constructions, such as dynamic random access memory (DRAM) devices, static random access memory (SRAM) devices, and ferroelectric memory (FERAM) devices, for example.

For substrates including semiconductor substrates or substrate assemblies, the layers can be formed directly on the lowest semiconductor surface of the substrate, or they can be formed on any of a variety of the layers (i.e., surfaces) as in a patterned wafer, for example.

Substrates other than semiconductor substrates or substrate assemblies can also be used in methods of the present invention. Any substrate that may advantageously form a metal containing layer thereon, such as a metal oxide layer, may be used, such substrates including, for example, fibers, wires, etc.

A preferred deposition process for the present invention is a vapor deposition process. Vapor deposition processes are generally favored in the semiconductor industry due to the process capability to quickly provide highly conformal layers even within deep contacts and other openings.

The precursor compounds can be vaporized in the presence of an inert carrier gas if desired. Additionally, an inert carrier gas can be used in purging steps in an ALD process (discussed below). The inert carrier gas is typically one or more of nitrogen, helium, argon, etc. In the context of the present invention, an inert carrier gas is one that does not interfere with the formation of the metal-containing layer. Whether done in the presence of a inert carrier gas or not, the vaporization is preferably done in the absence of oxygen to avoid oxygen contamination of the layer (e.g., oxidation of silicon to form silicon dioxide or oxidation of precursor in the vapor phase prior to entry into the deposition chamber).

Chemical vapor deposition (CVD) and atomic layer deposition (ALD) are two vapor deposition processes often employed to form thin, continuous, uniform, metal-containing (preferably dielectric) layers onto semiconductor substrates. Using either vapor deposition process, typically one or more precursor compounds are vaporized in a deposition chamber and optionally combined with one or more reaction gases and directed to and/or contacted with the substrate to form a metal-containing layer on the substrate. It will be readily apparent to one skilled in the art that the vapor deposition process may be enhanced by employing various related techniques such as plasma assistance, photo assistance, laser assistance, as well as other techniques.

Chemical vapor deposition (CVD) has been extensively used for the preparation of metal-containing layers, such as dielectric layers, in semiconductor processing because of its ability to provide highly conformal and high quality dielectric layers at relatively fast processing times. Typically, the desired precursor compounds are vaporized and then introduced into a deposition chamber containing a heated substrate with optional reaction gases and/or inert carrier gases in a single deposition cycle. In a typical CVD process, vaporized precursors are contacted with reaction gas(es) at the substrate surface to form a layer (e.g., dielectric layer). The single deposition cycle is allowed to continue until the desired thickness of the layer is achieved.

Typical CVD processes generally employ precursor compounds in vaporization chambers that are separated from the process chamber wherein the deposition surface or wafer is located. For example, liquid precursor compounds are typically placed in bubblers and heated to a temperature at which they vaporize, and the vaporized liquid precursor compound is then transported by an inert carrier gas passing over the bubbler or through the liquid precursor compound. The vapors are then swept through a gas line to the deposition chamber for depositing a layer on substrate surface(s) therein. Many techniques have been developed to precisely control this process. For example, the amount of precursor material transported to the deposition chamber can be precisely controlled by the temperature of the reservoir containing the precursor compound and by the flow of an inert carrier gas bubbled through or passed over the reservoir.

A typical CVD process may be carried out in a chemical vapor deposition reactor, such as a deposition chamber available under the trade designation of 7000 from Genus, Inc. (Sunnyvale, Calif.), a deposition chamber available under the trade designation of 5000 from Applied Materials, Inc. (Santa Clara, Calif.), or a deposition chamber available under the trade designation of Prism from Novelus, Inc. (San Jose, Calif.). However, any deposition chamber suitable for performing CVD may be used.

Several modifications of the CVD process and chambers are possible, for example, using atmospheric pressure chemical vapor deposition, low pressure chemical vapor deposition (LPCVD), plasma enhanced chemical vapor deposition (PECVD), hot wall or cold wall reactors or any other chemical vapor deposition technique. Furthermore, pulsed CVD can be used, which is similar to ALD (discussed in greater detail below) but does not rigorously avoid intermixing of precursor and reactant gas streams. Also, for pulsed CVD, the deposition thickness is dependent on the exposure time, as opposed to ALD, which is self-limiting (discussed in more detail below).

Alternatively, and preferably, the vapor deposition process employed in the methods of the present invention is a multi-cycle atomic layer deposition (ALD) process. Such a process is advantageous, in particular advantageous over a CVD process, in that in provides for improved control of atomic-level thickness and uniformity to the deposited layer (e.g., dielectric layer) by providing a plurality of deposition cycles. Further, ALD processes typically expose the metal precursor compounds to lower volatilization and reaction temperatures, which tends to decrease degradation of the precursor as compared to, for example, typical CVD processes.

Generally in an ALD process, each reactant is pulsed sequentially onto a suitable substrate, typically at deposition temperatures of at least about 25° C., preferably at least about 150° C., and more preferably at least about 200° C. Typical deposition temperatures are no greater than about 400° C., preferably no greater than about 150° C., and even more preferably no greater than about 250° C. These temperatures are generally lower than those presently used in CVD processes, which typically include deposition temperatures at the substrate surface of at least about 150° C., preferably at least about 200° C., and more preferably at least about 250° C. Typical deposition temperatures are no greater than about 600° C., preferably no greater than about 500° C., and even more preferably no greater than about 400° C. Under such conditions the film growth is typically self-limiting (i.e., when the reactive sites on a surface are used up in an ALD process, the deposition generally stops), insuring not only excellent conformality but also good large area uniformity plus simple and accurate thickness control. Due to alternate dosing of the precursor compounds and/or reaction gases, detrimental vapor-phase reactions are inherently eliminated, in contrast to the CVD process that is carried out by continuous coreaction of the precursors and/or reaction gases. (See Vehkamäki et al, "Growth of $SrTiO_3$ and $BaTiO_3$ Thin Films by Atomic Layer Deposition," Electrochemical and Solid-State Letters, 2(10):504-506 (1999)).

A typical ALD process includes exposing an initial substrate to a first chemical species A (e.g., a metal precursor compound such as that of Formula I) to accomplish chemisorption of the species onto the substrate. Species A can react either with the substrate surface of with Species B (described below) but not with itself. Typically in chemisorption, one or more of the ligands of Species A is displaced by reactive groups on the substrate surface. Theoretically, the chemisorption forms a monolayer that is uniformly one atom or molecule thick on the entire exposed initial substrate, the monolayer being composed of Species A, less any displaced ligands. In other words, a saturated monolayer is substantially formed on the substrate surface. Practically, chemisorption may not occur on all portions of the substrate. Nevertheless, such a partial monolayer is still understood to be a monolayer in the context of the present invention. In many applications, merely a substantially saturated monolayer may be suitable. A substantially saturated monolayer is one that will still yield a deposited layer exhibiting the quality and/or properties desired for such layer.

The first species (e.g., substantially all non-chemisorbed molecules of Species A) as well as displaced ligands are purged from over the substrate and a second chemical species, Species B (e.g., a different precursor compound or reactant gas) is provided to react with the monolayer of Species A. Species B typically displaces the remaining ligands from the Species A monolayer and thereby is chemisorbed and forms a second monolayer. This second monolayer displays a surface which is reactive only to Species A. Non-chemisorbed Species B, as well as displaced ligands and other byproducts of the reaction are then purged and the steps are repeated with exposure of the Species B monolayer to vaporized Species A. Optionally, the second species can react with the first species, but not chemisorb additional material thereto. That is, the second species can cleave some portion of the chemisorbed first species, altering such monolayer without forming another monolayer thereon, but leaving reactive sites available for formation of subsequent monolayers. In other ALD processes, a third species or more may be successively chemisorbed (or reacted) and purged just as described for the first and second species, with the understanding that each introduced species reacts with the monolayer produced immediately prior to its introduction. Optionally, the second species (or third or subsequent) can include at least one reaction gas if desired.

Thus, the use of ALD provides the ability to improve the control of thickness and uniformity of metal containing layers on a substrate. For example, depositing thin layers of precursor compound in a plurality of cycles provides a more accurate control of ultimate film thickness. This is particularly advantageous when the precursor compound is directed to the substrate and allowed to chemisorb thereon, preferably further including at least one reaction gas that reacts with the chemisorbed species on the substrate, and even more preferably wherein this cycle is repeated at least once.

Purging of excess vapor of each species following deposition/chemisorption onto a substrate may involve a variety of techniques including, but not limited to, contacting the substrate and/or monolayer with an inert carrier gas and/or lowering pressure to below the deposition pressure to reduce the concentration of a species contacting the substrate and/or chemisorbed species. Examples of carrier gases, as discussed above, may include $N_2$, Ar, He, etc. Additionally, purging may instead include contacting the substrate and/or monolayer with any substance that allows chemisorption by-products to desorb and reduces the concentration of a contacting species preparatory to introducing another species. The contacting species may be reduced to some suitable concentration or partial pressure known to those skilled in the art based on the specifications for the product of a particular deposition process.

ALD is often described as a self-limiting process, in that a finite number of sites exist on a substrate to which the first species may form chemical bonds. The second species might only bond to the first species and thus may also be self-limiting. Once all of the finite number of sites on a substrate are bonded with a first species, the first species will not bond to other of the first species already bonded with the substrate. However, process conditions can be varied in ALD to promote such bonding and render ALD not self-limiting, e.g., more like pulsed CVD. Accordingly, ALD may also encompass a species forming other than one monolayer at a time by stacking of a species, forming a layer more than one atom or molecule thick.

The described method indicates the "substantial absence" of the second precursor (i.e., second species) during chemisorption of the first precursor since insignificant amounts of the second precursor might be present. According to the knowledge and the preferences of those with ordinary skill in the art, a determination can be made as to the tolerable amount of second precursor and process conditions selected to achieve the substantial absence of the second precursor.

Thus, during the ALD process, numerous consecutive deposition cycles are conducted in the deposition chamber, each cycle depositing a very thin metal-containing layer (usually less than one monolayer such that the growth rate on average is from about 0.2 to about 3.0 Angstroms per cycle), until a layer of the desired thickness is built up on the substrate of interest. The layer deposition is accomplished by alternately introducing (i.e., by pulsing) precursor compound(s) into the deposition chamber containing a substrate, chemisorbing the precursor compound(s) as a monolayer onto the substrate surfaces, purging the deposition chamber, then introducing to the chemisorbed precursor compound(s) precursor compound(s) that may be the same as the first precursor compound(s) or may be other precursor compound(s) in a plurality of deposition cycles until the desired thickness of the metal-containing layer is achieved. Preferred thicknesses of the metal containing layers of the present invention are at least about 1 angstrom (Å), more preferably at least about 5 Å, and more preferably at least about 10 Å. Additionally, preferred film thicknesses are typically no greater than about 500 Å, more preferably no greater than about 200 Å, and more preferably no greater than about 100 Å.

The pulse duration of precursor compound(s) and inert carrier gas(es) is generally of a duration sufficient to saturate the substrate surface. Typically, the pulse duration is at least about 0.1, preferably at least about 0.2 second, and more preferably at least about 0.5 second. Preferred pulse durations are generally no greater than about 5 seconds, and preferably no greater than about 3 seconds.

In comparison to the predominantly thermally driven CVD, ALD is predominantly chemically driven. Thus, ALD may advantageously be conducted at much lower temperatures than CVD. During the ALD process, the substrate temperature may be maintained at a temperature sufficiently low to maintain intact bonds between the chemisorbed precursor compound(s) and the underlying substrate surface and to prevent decomposition of the precursor compound(s). The temperature, on the other hand, must be sufficiently high to avoid condensation of the precursor compounds(s). Typically the substrate temperature is kept within the range of about 25° C. to about 400° C. (preferably about 150° C. to about 300° C., and more preferably about 200° C. to about 250° C.), which, as discussed above, is generally lower than temperatures presently used in typical CVD processes. Thus, the first species or precursor compound is chemisorbed at this temperature. Surface reaction of the second species or precursor compound can occur at substantially the same temperature as chemisorption of the first precursor or, optionally but less preferably, at a substantially different temperature. Clearly, some small variation in temperature, as judged by those of ordinary skill, can occur but still be considered substantially the same temperature by providing a reaction rate statistically the same as would occur at the temperature of the first precursor chemisorption. Alternatively, chemisorption and subsequent reactions could instead occur at substantially exactly the same temperature.

For a typical vapor deposition process, the pressure inside the deposition chamber is at least about $10^{-6}$ torr, preferably at least about $10^{-5}$ torr, and more preferably at least about $10^{-4}$ torr. Further, deposition pressures are typically no greater than about 10 torr, preferably no greater than about 1 torr, and more preferably no greater than about $10^{-1}$ torr. Typically, the deposition chamber is purged with an inert carrier gas after the vaporized precursor compound(s) have been introduced into the chamber and/or reacted for each cycle. The inert carrier gas/gases can also be introduced with the vaporized precursor compound/compounds during each cycle.

The reactivity of a precursor compound can significantly influence the process parameters in ALD. Under typical CVD process conditions, a highly reactive compound may react in the gas phase generating particulates, depositing prematurely on undesired surfaces, producing poor films, and/or yielding poor step coverage or otherwise yielding non-uniform deposition. For at least such reason, a highly reactive compound might be considered not suitable for CVD. However, some compounds not suitable for CVD are superior ALD precursors. For example, if the first precursor is gas phase reactive with the second precursor, such a combination of compounds might not be suitable for CVD, although they could be used in ALD. In the CVD context, concern might also exist regarding sticking coefficients and surface mobility, as known to those skilled in the art, when using highly gas-phase reactive precursors, however, little or no such concern would exist in the ALD context.

After layer formation on the substrate, an annealing process may be optionally performed in situ in the deposition chamber in a nitrogen atmosphere or oxidizing atmosphere. Preferably, the annealing temperature is at least about 400° C., more preferably at least about 600° C. The annealing temperature is preferably no greater than about 1000° C., more preferably no greater than about 750° C., and even more preferably no greater than about 700° C.

The annealing operation is preferably performed for a time period of at least about 0.5 minute, more preferably for a time period of at least about 1 minute. Additionally, the annealing operation is preferably performed for a time period of no greater than about 60 minutes, and more preferably for a time period of no greater than about 10 minutes.

One skilled in the art will recognize that such temperatures and time periods may vary. For example, furnace anneals and rapid thermal annealing may be used, and further, such anneals may be performed in one or more annealing steps.

As stated above, the use of the complexes and methods of forming films of the present invention are beneficial for a wide variety of thin film applications in semiconductor structures, particularly those using high dielectric materials. For example, such applications include gate dielectrics and capacitors such as planar cells, trench cells (e.g., double sidewall trench capacitors), stacked cells (e.g., crown, V-cell, delta cell, multi-fingered, or cylindrical container stacked capacitors), as well as field effect transistor devices.

A system that can be used to perform vapor deposition processes (chemical vapor deposition or atomic layer deposition) of the present invention is shown in FIG. 1. The system includes an enclosed vapor deposition chamber 10, in which a vacuum may be created using turbo pump 12 and backing pump 14. One or more substrates 16 (e.g., semiconductor substrates or substrate assemblies) are positioned in chamber 10. A constant nominal temperature is established for substrate 16, which can vary depending on the process used. Substrate 16 may be heated, for example, by an electrical resistance heater 18 on which substrate 16 is mounted. Other known methods of heating the substrate may also be utilized.

In this process, precursor compound(s) (such as the precursor compound of Formula I) 60 and/or 61 are stored in vessels 62. The precursor compound(s) are vaporized and separately fed along lines 64 and 66 to the deposition chamber 10 using, for example, an inert carrier gas 68. A reaction gas 70 may be supplied along line 72 as needed. Also, a purge gas 74, which is often the same as the inert carrier gas 68, may be supplied along line 76 as needed. As shown, a series of valves 80-85 are opened and closed as required.

The following examples are offered to further illustrate various specific embodiments and techniques of the present invention. It should be understood, however, that many variations and modifications understood by those of ordinary skill in the art may be made while remaining within the scope of the present invention. Therefore, the scope of the invention is not intended to be limited by the following example. Unless specified otherwise, all percentages shown in the examples are percentages by weight.

EXAMPLES

Example 1

Synthesis and Characterization of a Homoleptic Precursor Compound of Formula I, where M=La, n=3, x=0, $R^1=R^2=CH(CH_3)_2$, $E=N(CH_2CH_3)_2$ In a dry box, a Schlenk flask was charged with 1.187 grams (g) lithium diethylamide and approximately 100 milliliters (mL) tetrahydrofuran (THF). The flask was placed under a vacuum and 2.35 mL of N,N'-diisopropylcarbodiimide was added via syringe through a rubber septum. The solution was stirred for approximately 3 hours (h).

A second Schlenk flask was charged in the dry box with 4.044 g $LaI_3(thf)_4$ and approximately 100 mL THF and the flask was placed under a vacuum. Lithium guanidinate solution was added slowly to the $LaI_3$ slurry over a period of approximately 3 hours then was stirred overnight under an argon atmosphere. Volatiles were stripped off in vacuo and the resulting oily amber solid was triturated with 2×5 mL pentane to partially remove coordinated THF. Volatiles were stripped off after each trituration and the solid became less oily. Also, a white solid was partially separated from the amber material. Crude solid (6.558 g) was collected under an argon atmosphere and charged into a sublimation vessel. Heating to 110° C. at 40 milliTorr (mTorr) produced an off-white crystalline solid sublimate. Under these conditions, 1.510 g of material was recovered (41% yield). Characterization data: ICP (elemental analysis)-% La found (calculated) 19.5 (18.9); TOF-MS-parent peak not seen, but the highest mass peak (201) consistent with ligand ion mass (199) and fragment peaks match expected fragmentation pattern of ligand; $^1$H NMR (C6D6) δ3.64 (septet, J=6.3 Hz, 6H, N—CH(CH$_3$)$_2$), 2.97 (b, 12H, N—CH$_2$—CH$_3$), 1.39 (b, 36H, N—CH(CH$_3$)$_2$), 0.98 (t, J=7 Hz, 18H, N—CH$_2$—CH$_3$); IR—moderate absorption at 1620 cm$^{-1}$, consistent with C=N stretching mode.

Example 2

Synthesis and Characterization of a Heteroleptic Precursor Compound of Formula I, where M=Hf, n=4, x=2, $R^1=R^2=CH(CH_3)_2$, $E=N(CH_3)_2$, $L=N(CH_3)_2$ In a dry box, a Schlenk flask was charged with 50 mL pentane and 7.7 mL 46% hafnium tetrakis(dimethylamide) in pentane. This flask was adapted to a vacuum/argon manifold and 3.1 mL of N,N'-diisopropylcarbodiimide was added dropwise at room temperature through argon overpressure. A mild exotherm and refluxing pentane was observed.

The reaction solution was stirred for four hours, then volatiles were removed in vacuo, affording 5.3 g of an off-white solid. The crude material was sublimed twice to afford a total yield of 3.74 g of analytically pure title compound (61% yield). The material was a white, crystalline solid.

Characterization data: ICP % Hf found (calculated) 29.8 (29.4); TOF-MS largest mass peak 569 amu, consistent with mass of parent compound less a dimethylamide ligand, other peaks consistent with other expected fragmentation products; $^1$H NMR (C6D6) δ 3.75(b, 4H, NCH(CH$_3$)$_2$), 3.39 (s, 12H, HfN(CH$_3$)$_2$), 2.52 (s, 12H, CN(CH$_3$)$_2$), 1.28 (b, 24H, NCH(CH$_3$)$_2$).

Example 3

Synthesis and Characterization of a Heteroleptic Precursor Compound of Formula I, where M=Hf, n=4, x=2, R$^1$=R$^2$=CH(CH$_3$)$_2$, E=OCH$_3$, L=N(CH$_3$)$_2$ In a dry box, a Schlenk flask was charged with 200 mL pentane and 10.2 g 52% hafnium tetrakis(dimethylamide) in pentane. This flask was adapted to a vacuum/argon manifold and 5.5 mL of O-methyl-N,N'-diisopropylisourea was added dropwise at room temperature through argon overpressure. Bubbling was observed, indicating the metathetical formation of volatile dimethylamine.

After 16 hours, the volatiles were removed in vacuo, affording a white paste. This crude product was sublimed at 105° C. and 50 mTorr to afford a white solid sublimate (1.05 g, 12% yield). Characterization data: ICP % Hf found (calculated) 31.5 (30.7).

Example 4

Deposition of a Precursor Composition of Formula I by Atomic Layer Deposition

The precursor from example 2 was used in a CVD process to prepare a metal-containing layer on a bare silicon wafer substrate. The precursor bubbler was heated to 140° C., and bubbler line to 180° C. Helium carrier gas at 39 sccm was passed over the bubbler and into the deposition chamber where the wafer was sitting on a chuck heated to 315° C. A stream of ozone (11% by weight in molecular oxygen) at 25 sccm was simultaneously introduced into the chamber. Both precursor and ozone were introduced for a period of three minutes. Upon removing the substrate from the chamber, a film was visually observed to have formed. X-ray diffraction (XRD) analysis showed peaks at 31, 35.5, and 51.5 degrees, indicating the formation of a hafnium-oxide-nitride film.

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A method of forming a metal-containing layer on a substrate, the method comprising:
   providing a substrate;
   providing a precursor composition comprising at least one compound of the formula (Formula I):

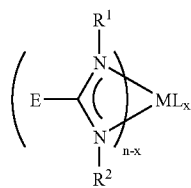

wherein:
   M is selected from the group consisting of a Group 2 to Group 15 metal, a lanthanide, an actinide, and combinations thereof;
   E is XR$^3$ or YR$^3$R$^4$, wherein X is O, S, or Se, and Y is N or P;
   each R$^1$, R$^2$, and R$^3$ is independently an organic group;
   R$^4$ is hydrogen or an organic group;
   L is an anionic supporting ligand;
   n is the oxidation state of M; and
   x is 0 to n-1;
   vaporizing the precursor composition; and
   contacting the vaporized precursor composition to form a metal-containing layer on the substrate using a vapor deposition process.

2. The method of claim 1 wherein X is oxygen or sulphur.

3. The method of claim 1 wherein the organic group is selected from the group consisting of an alkyl group, an aliphatic group, a cyclic group, and combinations thereof.

4. The method of claim 1 wherein L is selected from the group consisting of halides, amides, alkoxides, amidoxylates, amidinates, amidates, carboxylates, beta-diketonates, beta-iminoketones, beta-diketiminates, carbonylates, ketiminates, and combinations thereof.

5. The method of claim 1 wherein M is selected from the group consisting of Group 3 to Group 5 metals, Group 13 metals, lanthanides, and combinations thereof.

6. The method of claim 5 wherein M is selected from the group consisting of Hf, Zr, Al, La, Pr, and combinations thereof.

7. The method of claim 1 wherein the metal-containing layer is a metal-oxide layer.

8. The method of claim 1 wherein the metal-containing layer is a metal-nitride layer.

9. The method of claim 1 wherein the substrate is selected from the group consisting of a semiconductive material, a conductive material, a conductive metal-nitride, a conductive metal, and combinations thereof.

10. The method of claim 1 wherein the metal-containing layer has a thickness of about 1 angstrom to about 500 angstroms.

11. The method of claim 1 wherein R$^4$ is hydrogen.

12. The method of claim 1 wherein the organic group independently comprises 1 to 10 carbon atoms.

13. The method of claim 12 wherein the organic group independently comprises 1 to 4 carbon atoms.

14. The method of claim 1 wherein the vapor deposition process is a chemical vapor deposition process.

15. The method of claim 1 wherein the vapor deposition process is an atomic layer deposition process comprising a plurality of deposition cycles.

16. A method of manufacturing a semiconductor structure, the method comprising:
   providing a semiconductor substrate or substrate assembly;

providing at least one precursor compound of the formula (Formula I):

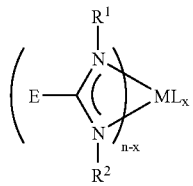

wherein:
M is selected from the group consisting of a Group 2 to Group 15 metal, a lanthanide, an actinide, and combinations thereof;
E is $XR^3$ or $YR^3R^4$, wherein X is O, S, or Se, and Y is N or P;
each $R^1$, $R^2$, and $R^3$ is independently an organic group;
$R^4$ is hydrogen or an organic group; L is an anionic supporting ligand;
n is the oxidation state of M; and
x is 0 to n-1;
providing at least one reaction gas;
vaporizing the precursor compound of Formula I; and
contacting the vaporized precursor compound of Formula I and the reaction gas with the substrate to form a metal-containing layer on the semiconductor substrate or substrate assembly using a vapor deposition process.

17. The method of claim 16 wherein X is oxygen or sulfur.

18. The method of claim 16 wherein the organic group is selected from the group consisting of an alkyl group, an aliphatic group, a cyclic group, and combinations thereof.

19. The method of claim 16 wherein $R^4$ is hydrogen.

20. The method of claim 16 wherein L is selected from the group consisting of halides, amides, alkoxides, amidoxylates, amidinates, amidates, carboxylates, beta-diketonates, beta-iminekotones, beta-diketiminates, carbonylates, ketiminates, and combinations thereof.

21. The method of claim 16 wherein the metal-containing layer is a metal-oxide layer.

22. The method of claim 16 wherein the metal-containing layer is a metal-nitride layer.

23. The method of claim 22 wherein the metal oxide layer is a dielectric layer.

24. The method of claim 16 wherein the metal-containing layer is a metal-nitride layer.

25. The method of claim 16 wherein M is selected from the group consisting of Group 3 to Group 5 metals, Group 13 metals, lanthanides, and combinations thereof.

26. The method of claim 25 wherein M is selected from the group consisting of Hf, Zr, Al, La, Pr, and combinations thereof.

27. The method of claim 16 wherein the metal oxide layer has a thickness of about 1 angstrom to about 500 angstroms.

28. The method of claim 16 wherein the organic group independently comprises 1 to 10 carbon atoms.

29. The method of claim 28 wherein the organic group independently comprises 1 to 4 carbon atoms.

30. The method of claim 16 wherein the at least one reaction gas is selected from the group consisting of oxygen, water vapor, ozone, nitrogen oxides, sulfur oxides, hydrogen, hydrogen sulfide, hydrogen selenide, hydrogen telluride, hydrogen peroxide, ammonia, organic amine, silane, disilane and higher silanes, diborane, plasma, air, borazene, carbon monoxide, alcohols, and combinations thereof.

31. The method of claim 16 further comprising an inert gas selected from the group consisting of nitrogen, argon, helium, and combinations thereof.

32. The method of claim 16 wherein the substrate is selected from the group consisting of a semiconductive material, a conductive material, a conductive metal-nitride, a conductive metal, and combinations thereof.

33. The method of claim 32 wherein the substrate is selected from the group of undoped silicon, doped silicon, borophosphosilicate glass (BPSG), tetraethylorthosilicate oxide (TEOS), TiN, TaN, GaAs, $SiO_2$, $RuO$, TaSiN, Pt, Ir, Rh, Ru, Al, Cu, W, and combinations thereof.

34. The method of claim 16 wherein the vapor deposition process is a chemical vapor deposition process.

35. The method of claim 34 wherein the temperature of the semiconductor substrate or substrate assembly is about 150° C. to about 600° C.

36. The method of claim 31 wherein the semiconductor substrate or substrate assembly is in a deposition chamber that has a pressure of about $10^{-6}$ torr to about 10 torr.

37. The method of claim 16 wherein the vapor deposition process is an atomic layer deposition process comprising a plurality of deposition cycles.

38. The method of claim 37 wherein during the atomic layer deposition process the metal-containing layer is formed by alternately introducing the vaporized precursor compound of Formula I and the reaction gas during each deposition cycle.

39. The method of claim 37 wherein the temperature of the semiconductor substrate or substrate assembly is about 25° C. to about 400° C.

40. The method of claim 34 wherein the semiconductor substrate or substrate assembly is in a deposition chamber that has a pressure of about $10^{-6}$ torr to about 10 torr.

41. A method of manufacturing a semiconductor structure, the method comprising:
providing a semiconductor substrate or substrate assembly within a deposition chamber;
providing a vapor comprising at least one precursor compound of the formula (Formula I):

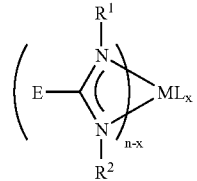

wherein:
M is selected from the group consisting of a Group 2 to Group 15 metal, a lanthanide, an actinide, and combinations thereof;
E is $XR^3$ or $YR^3R^4$, wherein X is O, S, or Se, and Y is N or P;
each $R^1$, $R^2$, and $R^3$ is independently an organic group;
$R^4$ is hydrogen or an organic group;
L is an anionic supporting ligand;
n is the oxidation state of M; and
x is 0 to n-1;
directing the vapor comprising the at least one precursor compound of Formula I to the semiconductor substrate or substrate assembly and allowing the at least one compound to chemisorb to at least one surface of the semiconductor substrate or substrate assembly;

providing at least one reaction gas; and directing the at least one reaction gas to the semiconductor substrate or substrate assembly with the chemisorbed species thereon to form a metal-containing layer on at least one surface of the semiconductor substrate or substrate assembly.

42. The method of claim 41 wherein X is oxygen or sulfur.

43. The method of claim 41 wherein the organic group is selected from the group consisting of an alkyl group, an aliphatic group, a cyclic group, and combinations thereof.

44. The method of claim 41 wherein L is selected from the group consisting of halides, amides, alkoxides, amidoxylates, amidinates, amidates, carboxylates, beta-diketonates, beta-iminekotones, beta-diketiminates, carbonylates, ketiminates, and combinations thereof.

45. The method of claim 41 wherein the metal-containing layer is a metal-oxide layer.

46. The method of claim 41 wherein the metal-containing layer is a metal-nitride layer.

47. The method of claim 41 wherein providing a vapor comprising at least one precursor compound of Formula I, directing the vapor to the semiconductor substrate or substrate assembly, providing at least one reaction gas, and directing the at least one reaction gas to the semiconductor substrate or substrate assembly is repeated at least once.

48. The method of claim 41 wherein the at least one reaction gas is selected from the group consisting of oxygen, water vapor, ozone, nitrogen oxides, sulfur oxides, hydrogen, hydrogen sulfide, hydrogen selenide, hydrogen telluride, hydrogen peroxide, ammonia, organic amine, silane, disilane and higher silanes, diborane, plasma, air, borazene, carbon monoxide, alcohols, and combinations thereof.

49. The method of claim 41 wherein the metal-containing layer has a thickness of about 1 angstrom to about 500 angstroms.

50. The method of claim 41 wherein the temperature of the semiconductor substrate or substrate assembly is about 25° C. to about 400° C.

51. The method of claim 41 wherein the deposition chamber containing the semiconductor substrate or substrate assembly has a pressure of about $10^{-6}$ torr to about 10 torr.

52. The method of claim 41 further comprising purging excess vapor comprising the at least one precursor compound of Formula I from the deposition chamber after chemisorption of the compound onto the semiconductor substrate or substrate assembly.

53. The method of claim 52 wherein purging comprises purging with an inert gas.

54. The method of claim 53 wherein the inert gas is selected from the group consisting of nitrogen, helium, argon, and combinations thereof.

55. A method of manufacturing a memory device structure, the method comprising;

providing a substrate having a first electrode thereon;

providing at least one precursor compound of the formula (Formula I):

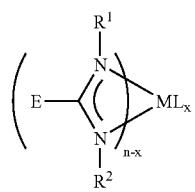

wherein:

M is selected from the group consisting of a Group 2 to Group 15 metal, a lanthanide, an actinide, and combinations thereof;

E is $XR^3$ or $YR^3R^4$, wherein X is O, S, or Se, and Y is N or P;

each $R^1$, $R^2$, and $R^3$ is independently an organic group;

$R^4$ is hydrogen or an organic group;

L is an anionic supporting ligand;

n is the oxidation state of M; and x is 0 to n-1;

vaporizing the at least one precursor compound of Formula I;

contacting the at least one vaporized precursor compound of Formula I with the substrate to chemisorb the compound on the first electrode of the substrate;

providing at least one reaction gas;

contacting the at least one reaction gas with the substrate with the chemisorbed compound thereon to form a dielectric layer on the first electrode of the substrate; and forming a second electrode on the dielectric layer.

56. A precursor composition for use in a vapor deposition process comprising at least one compound of the formula (Formula I):

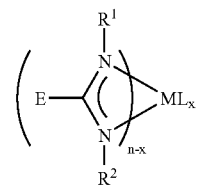

wherein:

M is selected from the group consisting of a Group 2 to Group 15 metal, a lanthanide, an actinide, and combinations thereof;

E is $OR^3$;

each $R^1$, $R^2$, and $R^3$ is independently an organic group;

L is an anionic supporting ligand;

n is the oxidation state of M; and x is 0 to n-1.

57. The precursor composition of claim 56 wherein the organic group is selected from the group consisting of an alkyl group, an aliphatic group, a cyclic group, and combinations thereof.

58. The precursor composition of claim 56 wherein L is selected from the group consisting of halides, amides, alkoxides, amidoxylates, amidinates, amidates, carboxylates, beta-diketonates, beta-iminekotones, beta-diketiminates, carbonylates, ketiminates, and combinations thereof.

59. A precursor composition for use in a vapor deposition process comprising at least one compound of the formula (Formula I):

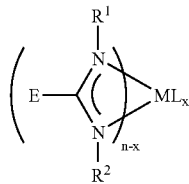

wherein:
M is lanthanum;
E is $XR^3$ or $YR^3R^4$, wherein X is O, S, or Se, and Y is N or P;
each $R^1$, $R^2$, $R^3$ is independently an organic group;
$R^4$ is hydrogen or an organic group;
L is an anionic supporting ligand;
n is the oxidation state of M; and
x is 0 to n-1.

60. The precursor composition of claim 59 wherein the organic group is selected from the group consisting of an alkyl group, an aliphatic group, a cyclic group, and combinations thereof.

61. The precursor composition of claim 59 wherein L is selected from the group consisting of halides, amides, alkoxides, amidoxylates, amidinates, amidates, carboxylates, beta-diketonates, beta-imineketones, beta-diketiminates, carbonylates, ketiminates, and combinations thereof.

62. A precursor composition for use in a vapor deposition process comprising at least one compound of the formula (Formula I):

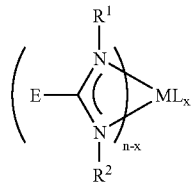

wherein:
M is hafnium;
E is $XR^3$ or $YR^3R^4$, wherein X is O, S, or Se, and Y is N or P;
$R^1$ and $R^2$ are isopropyl groups;
$R^3$ is an organic group;
$R^4$ is hydrogen or an organic group;
L is an anionic supporting ligand;
n is the oxidation state of M; and
x is 0 to n-1.

63. The precursor composition of claim 62 wherein the organic group is selected from the group consisting of an alkyl group, an aliphatic group, a cyclic group, and combinations thereof.

64. The precursor composition of claim 62 wherein L is selected from the group consisting of halides, amides, alkoxides, amidoxylates, amidinates, amidates, carboxylates, beta-diketonates, beta-imineketones, beta-diketiminates, carbonylates, ketiminates, and combinations thereof.

* * * * *

UNITED STATES PATENT AND TRADEMARK OFFICE
CERTIFICATE OF CORRECTION

| | |
|---|---|
| PATENT NO. | : 7,300,873 B2 |
| APPLICATION NO. | : 10/918308 |
| DATED | : November 27, 2007 |
| INVENTOR(S) | : Millward |

It is certified that error appears in the above-identified patent and that said Letters Patent is hereby corrected as shown below:

In column 21, lines 45–48, below "claim 22" delete
"23. The method of claim 22 wherein the metal oxide layer is a dielectric layer.
24. The method of claim 16 wherein the metal-containing layer is a metal-nitride layer.".

In column 23, line 53, in Claim 55, delete "comprising;" and insert
-- comprising: --, therefor.

Signed and Sealed this

Eighth Day of April, 2008

JON W. DUDAS
*Director of the United States Patent and Trademark Office*